United States Patent [19]
Cutchaw

[11] Patent Number: 4,884,169
[45] Date of Patent: Nov. 28, 1989

[54] BUBBLE GENERATION IN CONDENSATION WELLS FOR COOLING HIGH DENSITY INTEGRATED CIRCUIT CHIPS

[75] Inventor: John M. Cutchaw, Scottsdale, Ariz.

[73] Assignee: Technology Enterprises Company, Scottsdale, Ariz.

[21] Appl. No.: 299,795

[22] Filed: Jan. 23, 1989

[51] Int. Cl.$^4$ .............................................. H05K 7/20
[52] U.S. Cl. .................................. 361/385; 165/80.4; 165/104.33; 357/82
[58] Field of Search ................. 165/80.4, 80.5, 104.29, 165/104.33, 185, 903, 905; 357/82; 361/385, 387

[56] References Cited

U.S. PATENT DOCUMENTS

| | | | |
|---|---|---|---|
| 3,274,429 | 9/1966 | Swiadek . | |
| 4,203,129 | 5/1980 | Oktay et al. | 357/82 |
| 4,259,401 | 3/1981 | Chahroudi | 165/66 |
| 4,381,032 | 4/1983 | Cutchaw | 165/46 |
| 4,531,146 | 7/1985 | Cutchaw | 361/385 |
| 4,612,978 | 9/1986 | Cutchaw | 165/104.33 |
| 4,694,378 | 9/1987 | Nakayama et al. | 361/385 |
| 4,730,665 | 3/1988 | Cutchaw | 165/80.4 |
| 4,823,863 | 4/1989 | Nakajima et al. | 165/80.4 |

OTHER PUBLICATIONS

IBM Technical Disclosure Bulletin by J. E. McGregor, entitled "Component Support and Cooling", vol. 2, No. 5, Feb. 1960.
IBM Technical Disclosure Bulletin by R. C. Chu and R. E. Simons, entitled "Thermal Card and Deflector System for Augmenting Emersion Cooling", vol. 10, No. 10, Mar. 1968.
IBM Technical Disclosure Bulletin by G. E. Alcorn and J. R. Lynch, entitled "Promoting Nucleate Boiling of Semiconductor Devices in a Fluorocarbon Coolant", vol. 20, No. 4, Sep. 1977.
IBM Technical Disclosure Bulletin by V. W. Antonetti, H. E. Liberman and E. Simons, entitled "Integrated Module Heat Exchanger", vol. 20, No. 11A, Apr. 1978.
IBM Technical Disclosure Bulletin by R. C. Chu and J. H. Seely, entitled "Snap-On Nucleate Boiling Promoter", vol. 11, No. 3, Aug. 1968.

Primary Examiner—Gerald P. Tolin
Attorney, Agent, or Firm—Warren F. B. Lindsley

[57] ABSTRACT

An hermetically sealed, air-less multi-chambered structure for cooling semiconductor chips mounted on a substrate or printed circuit board which employs means for selectively providing a boiling-coolant generation of vapor bubbles for cooling purposes.

25 Claims, 2 Drawing Sheets

BUBBLE GENERATION IN CONDENSATION WELLS FOR COOLING HIGH DENSITY INTEGRATED CIRCUIT CHIPS

BACKGROUND OF THE INVENTION

This invention relates to cooling mechanisms and more particularly to an apparatus for cooling high-density integrated circuit packages.

With the miniaturized capabilities afforded by the discovery of solid state electronics, various means of dissipating heat generated by solid state components have been developed. One system involves a gas encapsulated cooling module which utilizes inert gas having a good thermal conductivity as the encapsulated medium in combination with a conductive heat transfer arrangement.

U.S. Pat. No. 4,381,032, discloses a base on which a high-density circuit package is nestingly mounted. A heat exchanger is mounted on the base so as to sealingly enclose the circuit package. The heat exchanger includes a rigid housing having a downwardly opening coolant chamber which is enclosed by a thin wall metallic diaphragm that rests in thermally conductive contiguous contact with each of the dice of the integrated circuit package. A liquid coolant is circulatingly moved through the coolant chamber which biases the diaphragm into conductive contact with the dice in addition to carrying away the heat generated by operation of the integrated circuit package. To insure a more positive contact between the diaphragm and the dice, additional biasing forces are applied to the diaphragm by elastomeric elements, or spring-loaded pistons, provided in the cooling chamber. These elastomeric elements, or spring-loaded pistons, apply their biasing force to localized areas of the diaphragm in contact with the dice of the circuit package. Although this prior art structure is quite efficient, its ability to carry away the operational heat of the operating integrated circuit package is limited by the heat transfer capabilities of the thin-wall diaphragm and the ability of the circulating coolant to absorb the heat transferred thereto by the diaphragm.

To improve on the above heat exchanger, the coolant chamber is filled with thermally conductive spheres so that they are in heat conductive contact with each other and with the membrane which separates the coolant chamber from the circuit packages. The thermal conductivity of the spheroids is superior to that of the coolant. Therefore, the heat conducted through the membrane wall is readily conducted to the spheroids at each point where they are in contact with the membrane, and the heat is similarly transferred to each of the spheroids in that each spheroid is in contact with the several spheroids adjacent thereto. This results in a substantial increase in the heat exchange surface thereby improving the transfer of heat from the circuit packages to the coolant.

Although filling the coolant chamber with thermally conductive spheroids provides an improvement over prior art cooling systems, there is still some loss in cooling efficiency due to the cooling chamber being separated from the source of heat by the thermally conductive membrane wall.

Therefore, a need exists for a new and improved apparatus for cooling high-density integrated circuit packages which overcomes some of the problems and shortcoming of the prior art.

DESCRIPTION OF THE PRIOR ART

Although the prior art discloses many types of fluid or gas encapsulated cooling modules further improvements are desirable.

U.S. Pat. No. 4,730,665 discloses an apparatus for containing and cooling high-density integrated circuit packages and includes a housing in which the circuit package is sealingly mounted in an internal chamber thereof. The chamber is at least partially filled with a plurality of thermally conductive spheroids which are biased into contact with each other and with the integrated circuit package to maximize the heat exchange surface. The apparatus includes an inlet and an outlet for passing a dielectric immersion coolant through the chamber in direct heat exchange relationship with the spheroids and with the high-density integrated circuit package.

U.S. Pat. No. 4,612,978 discloses an apparatus for cooling a high-density integrated circuit package including a base in which the circuit package is mounted. A heat exchanger is mounted on the base to enclose the circuit package and carry away the operational heat thereof by means of a coolant which is passed through the heat exchanger. The heat exchanger includes a housing having a coolant chamber with configured thermally conductive wall for engaging the integrated circuit package. The coolant chamber is filled with a plurality of thermally conductive spheroids which are biased into contact with each other and with the wall to maximize the heat exchange surface in the coolant chamber. The apparatus is preferably employed in combination with a refrigeration system wherein the coolant chamber is the evaporation element of the system for maximum cooling of the integrated circuit package.

Although spheres have been used in a module for thermal conducting reasons as evident from IBM's Technical Disclosure Bulletin by J. E. McGregor, entitled *Component Support and Cooling*, Vol. 2, No. 5, dated February, 1960, there is no teaching in this bulletin of using thermal conducting spheroids in conjunction with ceramic chip carriers and printed circuit boards for cooling purposes.

U.S. Pat. No. 3,274,429 further discloses the use by Raytheon of small metal balls in a closed container with water flowing through a cylindrical channel thereof for cooling purposes.

Of further background information relating to this disclosure, reference is also made to U.S. Pat. No. 4,203,129 which discloses a structure for cooling high-density integrated circuit devices composed of a heat sink bonded to the backside of the integrated circuit devices. The integrated circuit devices are mounted on a board and the board positioned so that tunnels in the heat sink are oriented vertically. These tunnels are totally immersed in a dielectric cooling liquid so that the integrated circuit devices are cooled by nucleate boiling and bubbles formed within the tunnels propagate outwardly thereof.

Further reference is made to IBM's Technical Disclosure Bulletin by R. C. Chu and R. E. Simons, Vol. 10, No. 10, March, 1968 entitled *Thermal Card and Deflector System for Augmenting Emersion Cooling* and U.S. Pat. No. 4,694,378 which discloses a deflector system for augmenting emersion cooling.

Still further reference is made to IBM's Technical Disclosure Bulletin Vol. 20, No. 4, September, 1977 entitled *Promoting Nucleate Boiling of Semiconductor Devices In A Fluorocarbon Coolant* by G. E. Alcorn and J. R. Lynch. With reference to "the random nature of nucleate boiling" in IBM's Technical Disclosure Bulletin Vol. 20, No. 11A, April 1978, by V. W. Antonetti, H. E. Liberman and R. E. Simons entitled *Integrated Module Heat Exchanger*, discloses nucleation cavities that enhances nucleate boiling. Reference is also made to IBM's Technical Disclosure Bulletin Vol. 11, No. 3, August 1968, entitled *Snap-On Nucleate Boiling Prompter* for further detail on nucleate boiling effects.

SUMMARY OF INVENTION

In accordance with the invention claimed, a new and improved hermetically sealed, air-less multi-chambered structure is provided for cooling semiconductor chips mounted on substrates, or printed circuit cards.

It is, therefore, one object of this invention to provide a new and improved apparatus for cooling high-density integrated circuit packages.

Another object of the present invention is to provide a new and improved apparatus for cooling high-density integrated circuit packages which is of minimum complexity, cost and size.

Another object of the present invention is to provide a new and improved apparatus for cooling high-density integrate circuit packages having improved heat transfer efficiency.

Another object of the present invention is to provide a new and improved apparatus for cooling high-density integrated circuit packages comprising a housing which sealingly encloses the package within a chamber and containing a plurality of thermally conductive spheroids for carrying heat away from the packages by means of a dielectric immersion coolant which is passed through the chamber of the housing.

Another object of the present invention is to provide an apparatus of the above described character wherein the plurality of thermally conductive spheroids contained within the chamber of the housing are biased into bearing engagement with each other and with the circuit packages to be cooled by a resilient elastomeric pressure pad.

Still another object of the present invention is to provide an apparatus of the above described character wherein the multiple spheroids in the chamber are arranged to present a tortuous coolant flow path through the chamber.

A further object of this invention is to provide a new and improved cooling module having increased Latent Heat Of Vaporization and increased Latent Heat of Condensation heat transport efficiencies by increased thermal conducting surface area offered by a thermal conducting porous spheroid matrix heat sink operating either in a liquid or in a vapor filled chamber respectively.

A still further object of this invention is to provide new and improved bubble generating and condensation tunnels or wells for cooling high-density integrated circuit chips by providing a boiling-coolant generation of vapor-bubbles that are trapped and condensed by thermal conducting spheroids in a vapor-filled cooling tunnel or well which is provided for each semiconductor chip, thereby preventing the heated rising bubbles of one chip from reaching an upper, or, adjacent chip and heating it up deleteriously.

A still further object of this invention is to provide a new and improved bubble generating heat exchanger which increases heat-transference between a first boiling coolant chamber and a, juxtapoised, second boiling-coolant chamber via vapor-bubble condensing cooling tunnels or wells.

A still further object of this invention is to provide a new and improved bubble generating heat exchanger which provides an increased transport of Latent-Heat-Of-Vaporization and increased transport of Latent-Heat-Of-Condensation by a lower boiling-point temperature than normal for a given liquid refrigerant at a given vapor pressure. The lower boiling point temperature is induced by use of catalytic-functioning crystalline or crystalline-like, sharp-edged particles which enhances bubble nucleation growth, when immersed in a vaporizable liquid refrigerant.

A still further object of this invention is to provide a new and improved bubble generating heat exchanger wherein an increased transport of Latent-Heat-of-Vaporization occurs by creating a lower boiling point temperature than normal for a given liquid refrigerant at a given vapor pressure. The lower than normal boiling-point temperature is induced by use of catalytic-functioning crystalline or crystalline-like, sharp-edged, particles which enhances bubble nucleation growth and intensity, when embedded within a thermally conducting porous spheroid matrix heat-sink that is immersed in a vaporizable liquid refrigerant within an airless, vapor-filled sealed chamber.

A still further object of this invention is to provide a new and improved bubble generating heat exchanger wherein the evolving bubbles, entrained within the porous heat sink of spheroids, pumps fluid coolant against adjacent spheroids thereby generating useful fluid turbulence action. The spheroids' fluid turbulence action scrubs away laminar heated coolant from the I.S. chip's heated surfaces, while forcing a greater influx of colder coolant against the same heated I.C. chip surfaces.

A still further object of this invention is to provide an integrated circuit package employing an improved mechanical vibration dampening structure within a boiling coolant module to protect the fragile electronic substrate.

A still further object of this invention is to provide a new and improved heat exchanger employing thermally conducting spheroid structures mounted adjacent to opposing major surfaces of the electronic substrate for added cooling effect.

A still further object of this invention is to essentially eliminate thermal hysterysis in the form of initial super heating (thermal overshoot) in order to begin nucleate boiling so as not to exceed the desired operating temperature of the associated semi conductor chips.

Further objects and advantages of this invention will become apparent as the following description proceeds and the features of novelty which characterize the invention will be pointed out with particularity in the claims annexed to and forming a part of this specification

BRIEF DESCRIPTION OF THE DRAWINGS

The present invention may be more readily described by reference to the accompanying drawings in which.

DESCRIPTION OF THE PREFERRED EMBODIMENT

Figure 1:
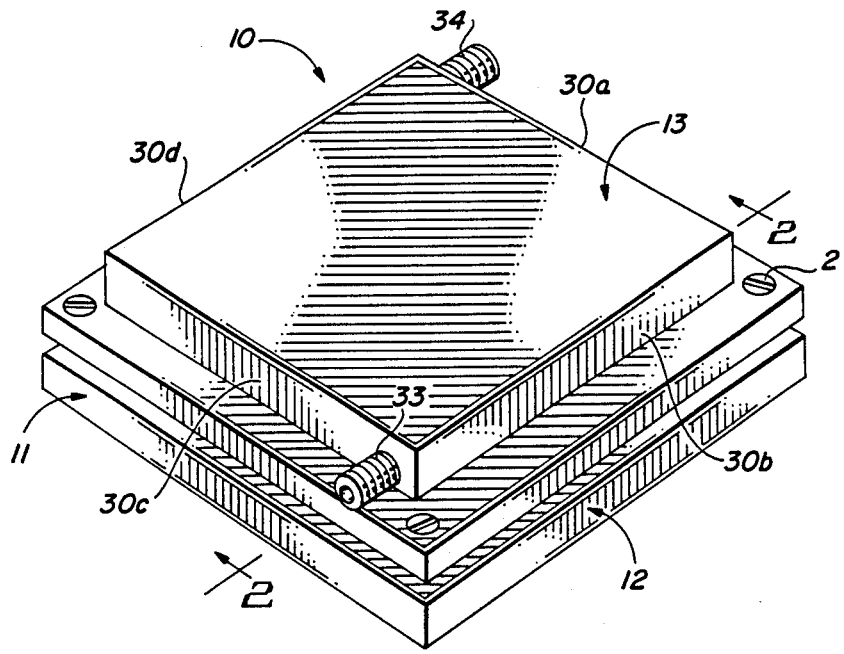
FIG. 1 is a perspective view of one embodiment of the apparatus for cooling high-density integrated circuit packages embodying the invention.

Referring more particularly to the drawings by characters of reference, FIG. 1 discloses an apparatus 10 for cooling high-density integrated circuits, intended for use in conjunction with refrigeration-coolant circulation system (not shown) and comprising a housing 11 having a base 12 and cover 13 which cooperates sealingly to enclose a high-density integrated circuit package 14 (FIG. 2) in a lower first chamber 15 within which a coolant is circulated to carry away the heat generated by operation of the package.

Figure 3:
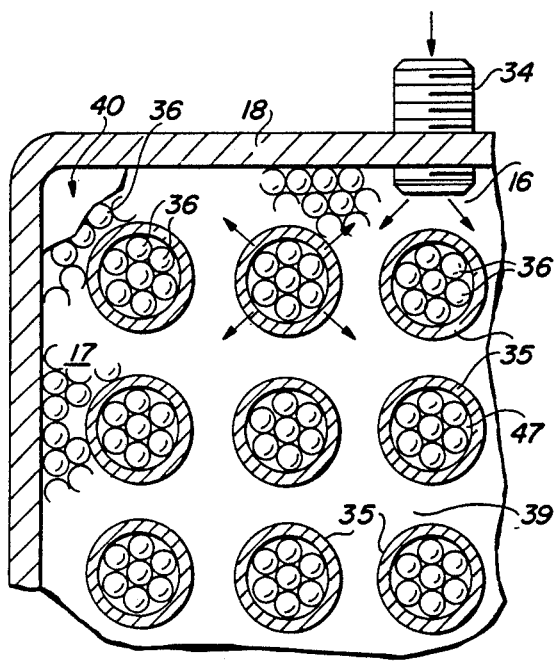
FIG. 3 is a cross sectional view of FIG. 2 taken along the line 3—3.

As shown in FIG. 3, base 12 is substantially a planar housing having a floor 17 with an endless upstanding sidewall 18 which defines the upwardly opening lower portion of chamber 15 for nestingly receiving circuit package 14. An array of conductive pins 21 depending from circuit package 14 pass through a different aperture in floor 17 of the base. As will be seen in the art suitable seals, such as glass, may be provided in each of the apertures through which pins 21 extend through base 12 whereby forming a hermetically sealed structure as shown in U.S. Pat. No. 4,730,665, incorporated herein by reference, for reasons which will become apparent as this description progresses.

Base 12 is also provided with internally threaded bores 22 at its corners for containing fastener means 23 by which cover 13 is detachably mounted on base 12. Fastener means 23 pass through suitable bores formed through each of the corners of cover 13 to demountably attach cover 13 to base 12.

The high-density integrated circuit package 14 forms no part of the apparatus of the present invention, but is shown and will now be briefly described for completeness of this disclosure. Package 14 includes a multilayer substrate, usually of ceramic, and the thereinbefore mentioned multiplicity of pins 21 extend from one planar surface of the substrate. Pins 21 provide means for making the necessary electrical interconnections between integrated circuit package 14 and the other components of the electronic system (not shown) in which the package is to be used. Further, in accordance with customary practices, pins 21 are also used to mount the package on a circuit board 25, which is indicated in phantom lines in FIG. 2, such as by soldering the pins in holes provided on the circuit board. The opposite planar surface of the multi-layer substrate has a plurality of discrete integrated circuits 26, or dice, mounted thereon in a predetermined geometric array which usually consists of a plurality of equally spaced rows and columns.

Figure 2:
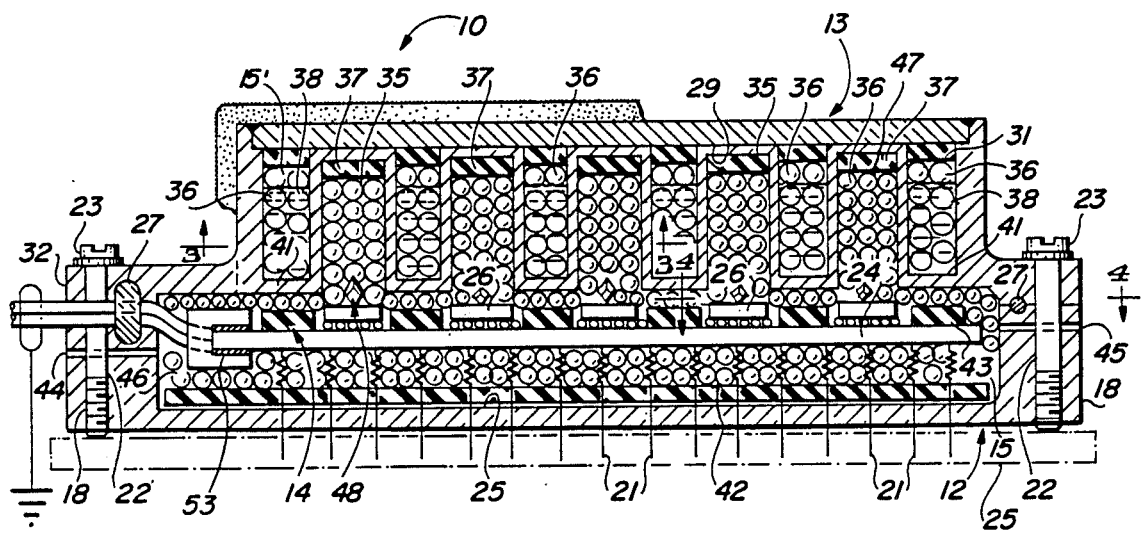
FIG. 2 is a sectional view of the apparatus taken along line 2—2 of FIG. 1.

As seen in FIG. 2, the upwardly opening lower portion of chamber 15 of base 12 is deeper than the thickness dimension of the substrate of the circuit package 14 and a suitable elastomeric seal 27 has its lower portion contained in an endless groove formed in the upwardly facing surface of sidewall 18. Seal 27 extends above the upwardly facing surface of the endless sidewall 18 of base 12 and has its upper end contained in a similar groove formed in cover 13, for sealingly encasing the integrated circuit package 14 in apparatus 10. .

Cover 13 comprises a housing formed by a roof wall 29 in combination with integrally depending endless sidewall segments 30a, 30b, 30c and 30d, which cooperatively define a downwardly opening second coolant chamber 15'. An endless flange 32 extends normally from the sidewall of cover 13.

Cover 13 of housing 11 is provided with a coolant inlet fitting 33 in the sidewall segment 30c of the cover housing and a coolant outlet fitting 34 is provided in the opposite sidewall segment 30a. If so desired inlet and outlet fittings 33 and 34 may be centered along segments 30a and 30c or positioned at any other place in cover 13 and still fall within the scope of this invention.

As shown in FIGS. 2 and 3 cover 13 of housing 11 is further formed to provide a plurality of wells or tunnels 35 each closed at one end adjacent wall 29 and open at their other ends directly above the integrated circuits, chips or dice 26. Each tunnel is filled with a plurality of thermally conductive beads or spheroids 36 with a resilient elastomeric pressure disk or pad 37 being contained within each tunnel at its closed end.

The space outside of each tunnel in cover 13 which is isolated from the hollow interior of base 12 of apparatus 10 is also filled or partially filled with thermally conductive spheroids 36, as shown in FIG. 2, with the cavities between the spheroids being filled with a refrigerant 38, thereby forming the second coolant chamber 15'. An apertured resilient elastomeric pressure plate 40 is provided over the assembly of thermally conductive spheroids 36 in the second coolant chamber 15' with each aperture in the plate receiving therein the closed end of tunnels 35.

The spheroids are formed of a material having good thermal conductive properties such as metal, ceramic or the like and substantially fill the upper portion of chamber 15'. Pressure pad 40 is contained within the upper portion of chamber 15' by means of a flange 41 formed around the outer periphery of the assembly of tunnels 35 as shown in FIG. 2. Pressure pad 40 is compressingly interposed between the inwardly facing surface of roof wall 29 and the upper layer of the spheroids. In this manner, pressure pad 40 will biasingly urge the spheroids toward flange 41 and into thermally conductive contact with each other.

As shown in FIG. 2 the upper end surfaces of the discrete integrated circuits are located in a plane which is approximate the top of base 12. Further, each well or tunnel 35 is open to the interior of the cavity in base 12 which contains the multi-layer substrate or printed circuit board having mounted on its top surface the integrated circuit dice or chips 26. The hollow cavity of base 12 is filled with spheroids which extend under, around its edges and on top of the ends of the substrate.

A resilient elastomeric plate 42 in the bottom of the cavity formed by base 12 together with resilient pads 43 bias the spheroids against the bottom of the substrate and each other for providing thermal conduct or contact between the spheroids in the base and also provide a vibration cushioning or dampening action between the parts of the apparatus. The resilient elastomeric pads 37, 40, 42 and 43 may be formed of a high temperature resilient elastomeric material such as silicone which may be impregnated with metallic particle filler so that the heat may be transferred therethrough to the cover 13 thereby acting as a heat sink.

It should be noted that when the base cavity of the apparatus is filled with a coolant through port 44 and air is being withdrawn or evacuated through port 45, both ports are then sealed closed and this coolant will also partially fill the interior of tunnels 35 since the open end of the tunnels open into the base cavity. This results in the upper ends of the tunnels or wells being air-less and vapor filled.

Since spheriods 36 are yieldingly biased against the base of the substrate by pressure pad 37, the spheroids within tunnels 35 will be in thermally conductive contact with the discrete integrated circuits 26 as shown in FIG. 2. In this manner, the heat produced by operation of the high-density integrated circuit package 14 will be transferred by conduction into the spheroids which are in thermally conductive contact therewith and those spheroids will, in turn, conductively transfer the heat through tunnel walls to all the other spheroids in the coolant chamber 15' of apparatus 10. An additional advantage provided by the multiplicity of spheroids is that they form a tortuous flow path for the coolant through the spheroids.

As noted from the above a hermetically sealed, airless multi-chambered structure is provided for cooling semiconductor chips mounted on substrates or printed circuit boards. A second boiling-coolant chamber 15' is thus employed in combination with an external circulating refrigeration system (Rankin type, not shown) for maximum cooling of the closely juxtapositioned first boiling-coolant chamber 15 comprising fluid interconnected portion 46 in base 12 and portion 47 in tunnels 35.

The portions 46 and 47 surround the top and bottom major surfaces of the chip populated electronic substrate. Unlike the second boiling-coolant chamber 15', the entrained vaporizable working fluid coolant in the portions 46 and 47 of boiling-coolant chamber 15 is permanently self-contained within the module and functions in a manner similar to a thermal conducting heat pipe. Fluid or vaporized coolant exchange between the portions 46 and 47 of the chamber 15 is provided by short wide coolant channels or tunnels extending or looping around the peripheral edges of the electronic substrate. These coolant flow channels also serve to equalize any coolant vapor pressure differential between opposing major surfaces of the electronic substrate regardless of any temperature differentials.

Heat generated by the semiconductor chips forming the integrated circuits 26 is transported from the first and second portions 46 and 47 at boiling-coolant chamber 15 to the second chamber 15' via the special high thermal conductivity cooling tunnels or wells 35 which are filled or partially filled with spheroids 36 and vaporized coolant.

Thus, during operation of apparatus 10 heat generated conductively passes from the chip's surface forming a part of the integrated circuits into the spheroids and surrounding coolant causing boiling vaporization bubbling. These bubbles are purposefully kept small in size by the geometrical size of the spheroids porous heat sink in conjunction with the spheroid's generated fluid turbulence remixing action. This turbulence remixing forces heated gas bubbles against adjacent thermal conducting spheroids causing vapor bubble recondensation thereby releasing latent heat to these adjacent spheroids which in turn pass the heat on to other thermally conducting spheroids. All the while this is happening the overall size of the bubbles is diminishing. If heat absorbing and heat conducting spheroids are not employed to minimize bubble formation size, the larger heat carrying bubbles would form heat vapor insulating pockets against adjacent rows of integrated circuits that would also need to be cooled by boiling coolant. These larger vapor-bubble pockets would prevent the liquid coolant from moving or flowing into thermal contact with the heat chip surface and this would result in over-heated semiconductor chips causing burnout failure of the circuits. This above explanation is especially true if the overall cooling module assembly is mounted and operated in a vertical position.

As the Latent and Sensible Heat is passed upwardly by vaporization and condensation throughout the second and third chambers of the structure shown in FIG. 2 including tunnels 35, the heat finally passes conductively through the outer walls of tunnel 35 into the flowing-moving vaporizing refrigerant of chamber 39. This vaporized refrigerant being a circulating part of an endless, closed refrigeration system or loop has its acquired heat carried away and externally removed to the outside atmosphere via standard condensation coils with air-cooling fins and blowers or the like. Recirculating liquid coolant or liquid refrigerant serves to maintain low operation temperatures for the integrated circuit module system. For even higher heat transference efficiencies the first chamber's interior is filled with spheroids 36, as shown.

As disclosed, these spheroids filled cooling wells 35 serve as heat pipes with their Latent-Heat-Of-Vaporization (heat absorption) taking place in a common chamber 15 housing all of the semiconductor dice or chips and then extending individually from each dice or chip into a second portion 47 of the boiling-coolant chamber 15 with vapor condensation occurring along the spheroid filled cooling tunnel walls, thereby releasing and liberating the Latent-Heat-Of-Condensation to cause it to pass through the thermally conductive wall of the cylindrical cooling tunnel of each individual cooling well. The condensed vapor, having released its Latent-Heat-Of-Condensation, then drops or trickles down the tunnel walls and spheroids to the dice or chips in an endless heat cycle to cool down the heated surface of the semiconductor chips.

Figure 4:
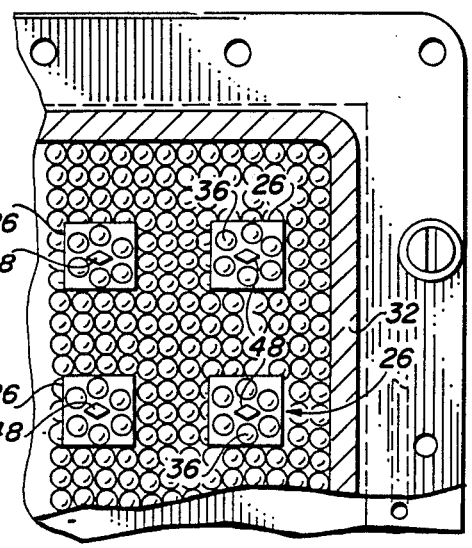
FIG. 4 is a cross sectional view of FIG. 3 taken along line 4—4.

In accordance with the invention claimed, a small, jagged sub-split pea size particle of a silica gel material 48 is centrally placed upon or closely spaced from the surface of each dice or chip, as shown in FIGS. 2 and 4. This silica gel particle serves as a catalyst to vigorously enhance boiling-cooling vapor bubble nucleation growth around the surface of the semiconductor dice o chip 26 in order to more effectively remove the heat of operation of the module. This silica gel catalyst bubble seeding action provides boiling-coolant action at selective locations and at a considerably lower boiling point temperature than obtained when using only spheroids for more efficient cooling operation and at lower energy costs of the module. Vapor bubble generation vigorously commences at the sharp crystalline edges of the silica gel particles and as heating increases the bubbling action spreads to adjacent heated surfaces.

Many other crystalline angled materials such as quartz or even semiconductor silicon crystals might serve as a catalyst to increase boiling-coolant action in the air-less boiling-coolant portions 46 and 47 of chamber 15. It is even possible that angle crystals cleavages might be designed or grown right into the peripheral edges of the semiconductor chip to enhance heat removal from the coolant immersed semiconductor chip.

In accordance with the teaching of this disclosure thermal conducting spheroids 36 are positioned to surround and captivate each of the catalytic silica gel particles 48 to form a porous matrix thermal conducting heat sink directly upon the semiconductor chip or dice surface. This thermal conducting porous matrix heat sink allows passage for bubble nucleation growth or coolant vaporization with vapor expansion that produces the refrigeration cooling effect. It should be noted that spheroids offer greater conductive surface area than conventional cooling fins or heat radiators. Further, spheroids generate useful fluid turbulence that breaks up stagnant boundary layer laminar heating for greater fluidic mixing between hot and cold fluids to improve heat transference.

It should be noted that the disclosed multiple refrigeration compartment cooling module permits the removal and disassembly of the second boiling-coolant chamber 15' from the interconnected portions 46 and 47, for repairs or replacement, yet, prevents air from entering the sealed, air-less second boiling-coolant chamber 15' that leads to the external refrigeration system that cools other cooling modules. Thus, only the cooling module having electronic repair problems needs to be interrupted temporarily from the overall cooling system.

It should be noted that the entire self contained and sealed air-less volume of portions 46 and 47 of the first boiling-coolant chamber 15 must never be entirely filled with liquid refrigerant or coolant. Since virtually all liquids are non-compressible there would be no room for liquid expansion during heating operations, thereby causing liquid pressure to build up that would rupture the module's structural walls. Further, for optimum heat transference within the tunnels there must be room for vaporized bubble expansion before vapor condensation in order to more fully exploit the well known principles of Latent-Heat-Of-Vaporization and Latent-Heat-Of-Condensation.

In other words, there must be, at least, a small vaporized coolant pocket or air-less chamber located at the closed end within each cooling well or tunnel. This air-less vaporized coolant pocket will recondense in the non-operating state causing or creating a vacuum above the coolant level within each tunnel. This is a necessary prerequisite for standard heat pipe operation of the cooling wells or tunnels.

FIGS. 2 and 4-6 disclose various ways of mounting particle 48 in the various tunnel configurations.

Figure 5:
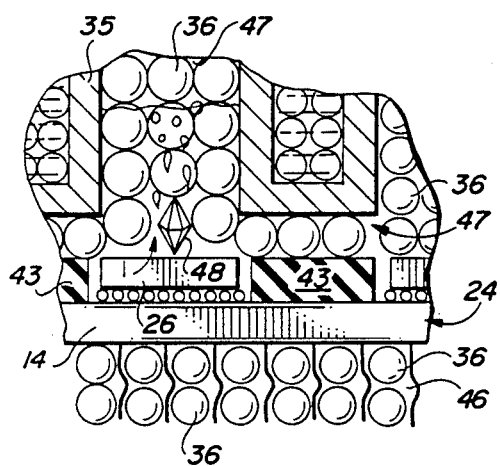
FIG. 5 is an enlarged view of the circled area marked 5 in FIG. 3.

In FIGS. 2, 4 and 5 particle 48 may be loosely or fixedly mounted in the center of the lower array of spheroids assembled immediately adjacent to the chip or dice 26.

Figure 6:
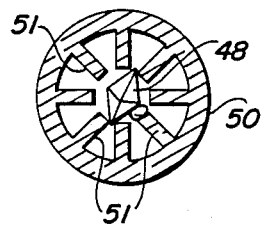
FIG. 6 is a modification of the cooling tunnel or well shown in FIGS. 3 and 5 showing another method of holding the embedded silica gel particle.

In FIG. 6 the tunnel well 50 is provided with inwardly projecting fins 51 in place of spheroids with the fins of the tunnel well physically holding the particle adjacent the chip or dice 26 in the center of the tunnel.

Figure 7:
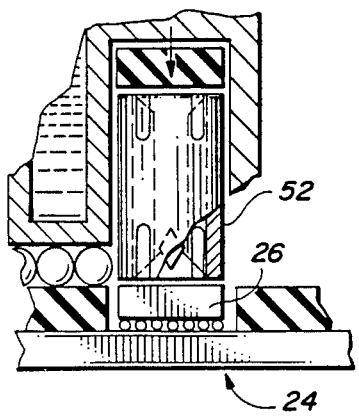
FIG. 7 is a modification of FIG. 5 showing the use of spheroids under the integrated circuit.

FIG. 7 discloses another modification of the structure shown in FIGS. 1-6 wherein a slotted resiliently biased piston 52 is mounted within tunnels 35 immediately adjacent to and above dice 26 for operating in the manner of the prior art. This piston is provided with catalytic particle 48 embedded by the fins within the piston, as shown.

Figure 8:
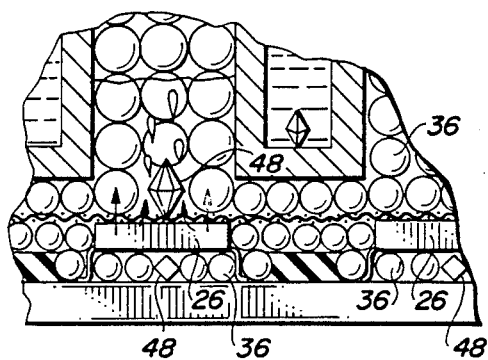
FIG. 8 is a still further modification of FIG. 6 showing a movable piston employing a embedded crystal particle therein.

FIG. 8 discloses a still further modification of the spheroid arrangement shown in FIGS. 1-5 wherein spheroids 35 and particle 48 may also be mounted underneath the chip or dice 26 between the chip or dice and the substrate forming a part of the integrated circuit for further cooling effect. Further, the spheroids may be of the same or different diameters and additionally serve to reduce the effects of vibration. It should be noted that a small mesh screen 50 may be placed across the top of the integrated circuits 26, as shown in FIG. 8, to secure the catalytic crystalline particles 48 in proper position and to hold spheroids 36 within the cooling wells or tunnels 35 so that they will not spill out or mix whenever the apparatus is opened for circuit board repairs.

As shown in FIG. 2 the apparatus may be provided with a grounded shielded cable connection 53 in some applications where vibration is a factor in lieu of the flexible depending connector pin assembly 21.

Mechanical vibration from harsh environments (external) acting against the module and electronic substrate also tends to induce frictional rotation of the resilient biased spheroids against one another thereby converting energy of vibration to a buildup of frictional energy spheroid heating which is conveniently dissipated or carried off by the chilled flowing coolant or refrigerant.

Although but a few embodiments have been illustrated and described, it will be apparent to those skilled in the art that various changes and modifications may be made therein without departing from the spirit of the invention or from the scope of the appended claim.

What is claimed is:

1. An apparatus for containing and cooling a high-density integrated circuit package comprising in combination:
   a base,
   a high-density integrated circuit mounted on said base,
   a heat exchanger mounted on said base to enclose said circuit and carry away the operational heat thereof by means of a coolant which is passed through said heat exchanger,
   said heat exchanger comprising a housing having an especially configured thermally conductive wall for providing an elongated tunnel over said circuit,
   said tunnel being closed at one end and open at its other end which other end is juxtapositioned to said circuit,
   a plurality of thermally conductive spheroids arranged in said tunnel and biased into thermally conductive contact with each other, with said circuit and said wall forming said tunnel to maximize heat transfer from said circuit to said wall, and
   a particle centrally positioned in said spheroids in said tunnel at a point juxtapositioned to said circuit for catalytically enhancing bubble nucleation growth around said circuit.

2. The apparatus set forth in claim 1 wherein:
said spheroids comprise beads.

3. The apparatus set forth in claim 1 wherein:
said particle comprises a jagged edge configuration.

4. The apparatus set forth in claim 1 wherein:
said particle comprises a crystalline angled configuration.

5. The apparatus set forth in claim 1 wherein:
said particle comprises a silica gel material serving as a catalyst to enhance bubble nucleation.

6. The apparatus set forth in claim 1 wherein:
said coolant comprises a boiling coolant.

7. The apparatus set forth in claim 1 wherein:
said particle comprises a crystalline material which serves as a catalytic enhancer for bubble nucleation growth acceleration.

8. The apparatus set forth in claim 1 wherein:
said particle is attached to some of said spheroids.

9. The apparatus set forth in claim 1 in further combination with:
a mesh screen mounted in said base between said circuit and said tunnel for holding said spheroids in said tunnel.

10. The apparatus set forth in claim 1 wherein:
said spheroids in said tunnel are biased by piston means mounted within said tunnel.

11. The apparatus set forth in claim 1 wherein:
said tunnel and said spheroids therein form an air evacuated chamber.

12. An apparatus for containing and cooling a high density integrated circuit package comprising in combination:
a base,
a high-density integrated circuit mounted on said base,
a heat exchanger mounted on said base to enclose said circuit and carry away the operational heat thereof by means of a coolant which is passed through said heat exchanger,
said heat exchanger comprising a housing having a specifically configured thermally conductive wall for providing an elongated tunnel over said circuit,
said tunnel being closed at one end and open at its other end which other end is juxtapositioned to said circuit,
said tunnel being provided with a plurality of fins extending inwardly of its inside periphery, and
a particle centrally positioned within said tunnel and secured by said fins for enhancing bubble nucleation growth around said cirucit.

13. The apparatus set forth in claim 12 wherein:
said coolant comprises a boiling coolant.

14. The apparatus set forth in claim 12 wherein:
said particle comprises a crystalline configuration which serves as a catalytic enhancer for bubble nucleation growth acceleration.

15. The apparatus set forth in claim 12 wherein:
said particle comprises a silica gel material.

16. The apparatus set forth in claim 12 wherein:
said particle comprises a quartz crystal.

17. The apparatus set forth in claim 12 wherein:
said particle comprises a part of a quartz crystal.

18. An apparatus for containing and cooling a high-density integrated circuit package comprising in combination:
a base housing defining an open chamber,
at least one high-density integrated circuit package mounted in the bottom of the chamber of said base housing, said package including a substrate having at least one discrete integrated circuit mounted on one surface thereof,
a cover demountably attached to said base housing for sealingly enclosing said chamber,
said cover comprising a metallic flange extending over said open chamber of said base and being offset at a plurality of points along its surface to provide a plurality of tunnels extending into said cover, said tunnels being closed at one end in said cover and open at their other ends into said chamber of said base, the open end of each of said tunnels being juxtapositioned to a different discrete integrated circuit mounted on said one surface of said substrate,
a plurality of spheroids,
a first portion of said spheroids being assembled in each of said tunnels and in contact with the associated juxtapositioned integrated circuit, a second portion of said spheroids being formed around the top, ends and other side of said substrate, and a third portion of said spheroids at least partially filling the void in said cover extending around said tunnels,
biasing means interposed between the closed end of said tunnels and the first portion of said spheroids in said tunnels, between said base and the second portion of said spheroids, and between said cover and said third portion of said spheroids for biasing said spheroids into thermal conductive contact with each other, the walls of said tunnels, and with each of the discrete integrated circuits,
inlet port means and outlet port means by which a first dielectric immersion coolant is passable through said third portion of said spheroids, and
means for immersing said first and second portions of said spheroids in a second dielectric coolant.

19. The apparatus set forth in claim 18 in further combination with:
a jagged crystalline straight angled edge particle centrally positioned within each of said tunnels at a point juxtapositioned to its associated circuit for enhancing bubble nucleation growth around the associated circuit.

20. The apparatus set forth in claim 18 in further combination with:
a fourth portion of said spheroids being interposed between each of said circuits and its associated substrate.

21. The apparatus set forth in claim 20 in further combination with:
a jagged edge particle centrally positioned within said portion of said spheroids.

22. The apparatus set forth in claim 18 wherein:
said tunnels filled with said first portion of said spheroids comprise air evacuated chambers.

23. The apparatus set forth in claim 22 wherein:
said void in said cover is air less.

24. An apparatus for containing and cooling a high-density integrated circuit package comprising in combination:
a base housing defining an open chamber,
at least one high-density integrated circuit package mounted in the bottom of the chamber of said base housing, said package including a substrate having at least one discrete integrated circuit mounted on one surface thereof,
a cover demountably attached on said base housing for sealingly enclosing said chamber,
said cover comprising a metallic flange extending over said open chamber of said base and being offset at a plurality of points along its surface to provide a plurality of tunnels extending into said cover, said tunnels being closed at one end in said cover and open at their other ends into said chamber of said base, the open end of each of said tunnels being juxtapositioned to a different discrete integrated circuit mounted on said one surface of said substrate, a plurality of steroids, a first portion of said spheroids being assembled in each of said tunnels and in contact with the associate juxtapositioned integrated circuit, a second portion of said spheroids being formed around ends and both major sides of said substrate to form a mechanical vibration dampening structure when said spheroids are immersed in a coolant, and a third portion of said spheroids at least partially filling the void in said cover extending around said tunnels, biasing means interposed between the closed end of said tunnels and the first portion of said spheroids in said tunnels, between said base and the second portion of said spheroids, and between said cover and said third portion of said spheroids for biasing said spheroids into thermal conductive contact with each other, the walls of said tunnels, and with each of the discrete integrated circuits, inlet port means and outlet port means by which a first dielectric immersion coolant is passable through said first portion of said spheroids, and means for immersing said second and third portions of said spheroids in a second dielectric coolant.

25. The apparatus set forth in claim 24 in further combination with:

a water-proof thermal insulating cover surrounding at least a part of said base housing and said cover for use in adverse heat operating environment.

* * * * *

UNITED STATES PATENT OFFICE
CERTIFICATE OF CORRECTION

Patent No. 4,884,169　　　　　　　　　Dated November 28, 1989

Inventor(s) John M. Cutchaw

It is certified that error appears in the above-identified patent and that said Letters Patent is hereby corrected as shown below:

Claim 24, line 22, after "a plurality of" delete "steroids" and substitute ---spheroids---.

Signed and Sealed this

Twenty-seventh Day of November, 1990

Attest:

HARRY F. MANBECK, JR.

*Attesting Officer*　　　　*Commissioner of Patents and Trademarks*